(12) United States Patent
Chiang

(10) Patent No.: US 6,286,081 B1
(45) Date of Patent: Sep. 4, 2001

(54) MECHANISM FOR ENSURING DATA COHERENCY DURING SEQUENTIAL READINGS OF PORTIONS OF DATA THAT CHANGES WITH TIME

(75) Inventor: John M. Chiang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/081,743

(22) Filed: May 19, 1998

(51) Int. Cl.[7] ....................................................... G06F 13/00
(52) U.S. Cl. ............................ 711/141; 711/100; 711/154
(58) Field of Search .................................... 711/114, 129, 711/100, 141, 154

(56) References Cited

U.S. PATENT DOCUMENTS

| | | | |
|---|---|---|---|
| 4,622,631 | * 11/1986 | Frank et al. | 707/101 |
| 5,251,308 | * 10/1993 | Frank et al. | 711/163 |
| 5,737,750 | * 4/1998 | Kumar et al. | 711/129 |
| 5,933,850 | * 8/1999 | Kumar et al. | 711/129 |
| 6,018,791 | * 1/2000 | Arimilli et al. | 711/141 |

* cited by examiner

Primary Examiner—Tuan V. Thai
(74) Attorney, Agent, or Firm—Monica H. Choi

(57) ABSTRACT

An apparatus and a method ensure coherency between portions of data from a data generator which are sequentially read by a reading device at least one portion at a time, even though that data within the data generator is changing with time. The present invention stores a prior status of bits of data from the data generator at a prior time point. The present invention then transfers data portions from this stored data as the reading device continues to sequentially read portions of that stored data of the prior time point. When the reading device has finished reading the portions of the data of the prior time point, the present invention stores a subsequent status of bits of data from the data generator at a subsequent time point. Then, the process for ensuring coherency between portions of data, that are sequentially read, repeats for the subsequent time point. Thus, the present invention allows the reading device to read data portions at a time while ensuring coherency among those portions and thus accuracy in the data read by the reading device.

9 Claims, 2 Drawing Sheets

US 6,286,081 B1

MECHANISM FOR ENSURING DATA COHERENCY DURING SEQUENTIAL READINGS OF PORTIONS OF DATA THAT CHANGES WITH TIME

TECHNICAL FIELD

This invention relates to digital electronic systems, and more particularly, to an apparatus and method for ensuring data coherency during sequential readings of portions of data even though such data changes with time.

BACKGROUND OF THE INVENTION

Referring to FIG. 1, a data generator 100 generates data having a plurality of portions. For example, the data generator 100 may be a counter or a register having a plurality of bits as data. For instance, referring to FIG. 1, a first portion 102 of the data includes a first 8-bit (byte) portion, a second portion 104 of the data includes a second 8-bit (byte) portion, a third portion 106 of the data includes a third 8-bit (byte) portion, and a fourth portion 108 of the data includes a fourth 8-bit (byte) portion. With many common types of the data generator 100, such as a counter or a register, the data bits constantly change with time.

An electronic reading device which reads the 32-bit data from the data generator 100 in many cases cannot read all 32-bits of the data together at once. The electronic reading device may lack the data capacity necessary for reading 32-bits of the data together at once. In that case, the electronic reading device sequentially reads the data, at least one portion at a time. For example, referring to FIG. 1, the electronic reading device may have the data capacity for reading 8-bits at a time. In such an example, the electronic reading device may sequentially read the first 8-bit portion 102, then the second 8-bit portion 104, then the third 8-bit portion 106, and then finally, the fourth 8-bit portion 108. In this example, each 8-bit portion is read sequentially one portion at a time.

However, each bit of the 32-bits within the data generator 100 is updated with time. Thus, between the time the electronic reading device reads the first portion 102 and the time the electronic reading device reads any subsequent portion (i.e., the second portion 104, the third portion 106, or the fourth portion 108), any bit within the 32-bit data may be changed. In that case, the four portions 102, 104, 106, and 108 which are thus sequentially read do not represent the data of the data generator 100.

In such a scenario, the four portions are deemed to be "incoherent." Incoherent data is an inaccurate representation of the content of the data generator 100. However, many electronic reading devices can only read data from the data generator 100 in a plurality of sequential portions rather than all of the bits at once. Thus, a mechanism for ensuring coherency among the portions of data sequentially read from the data generator 100 is desired.

SUMMARY OF THE INVENTION

Accordingly, a primary object of the present invention is to allow an electronic reading device to sequentially read portions of data bits at a time while ensuring coherency among such portions.

In a general aspect, the present invention ensures data coherency when data comprising a plurality of portions is read sequentially at least one portion at a time by a reading device, wherein the data changes with time. The present invention includes a data storage unit for storing the plurality of portions of the data having a prior status at a prior time point when the reading device begins to read at least one portion of the data at the prior time point. The present invention also includes a monitoring unit for determining whether the reading device is continuing to read the plurality of portions of the data having the prior status of the prior time point. In addition, the present invention further comprises a multiplexing unit, operatively coupled to the data storage unit, the reading device, and the monitoring unit, for transferring at least one portion of the data having the prior status from the data storage unit to the reading device when the reading device continues to read at least one portion of the data having the prior status of the prior time point.

The present invention may be used to particular advantage when the monitoring unit also determines when the reading device begins reading at least one portion of the data having a subsequent status at a subsequent time point. In that case, the multiplexing unit transfers to the electronic reading device at least one portion of the data having the subsequent status of the subsequent time point, and the data storage unit stores the plurality of portions of the data having the subsequent status of the subsequent time point.

In another aspect of the present invention, the monitoring unit monitors whether any portion of the plurality of portions of the data is read for a second time in determining that the reading device begins reading the data having the subsequent status.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference numeral in FIGS. 1–3 refer to elements having similar structure and function.

DETAILED DESCRIPTION

Figure 1:
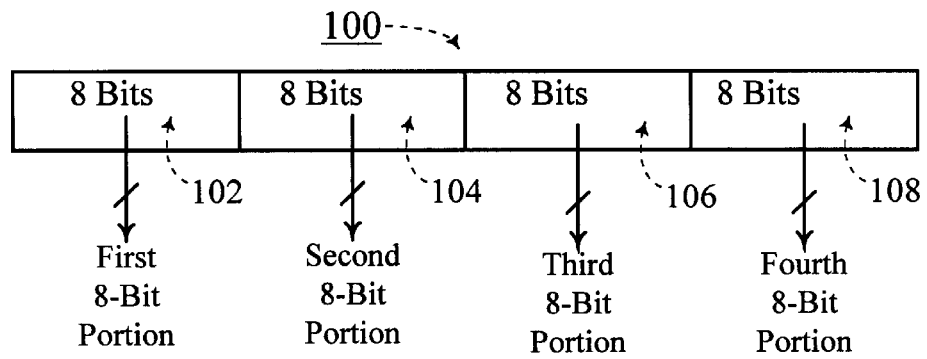
FIG. 1 shows a data generator with data having a plurality of portions which a reading device sequentially reads at least one portion at a time.
Figure 2:
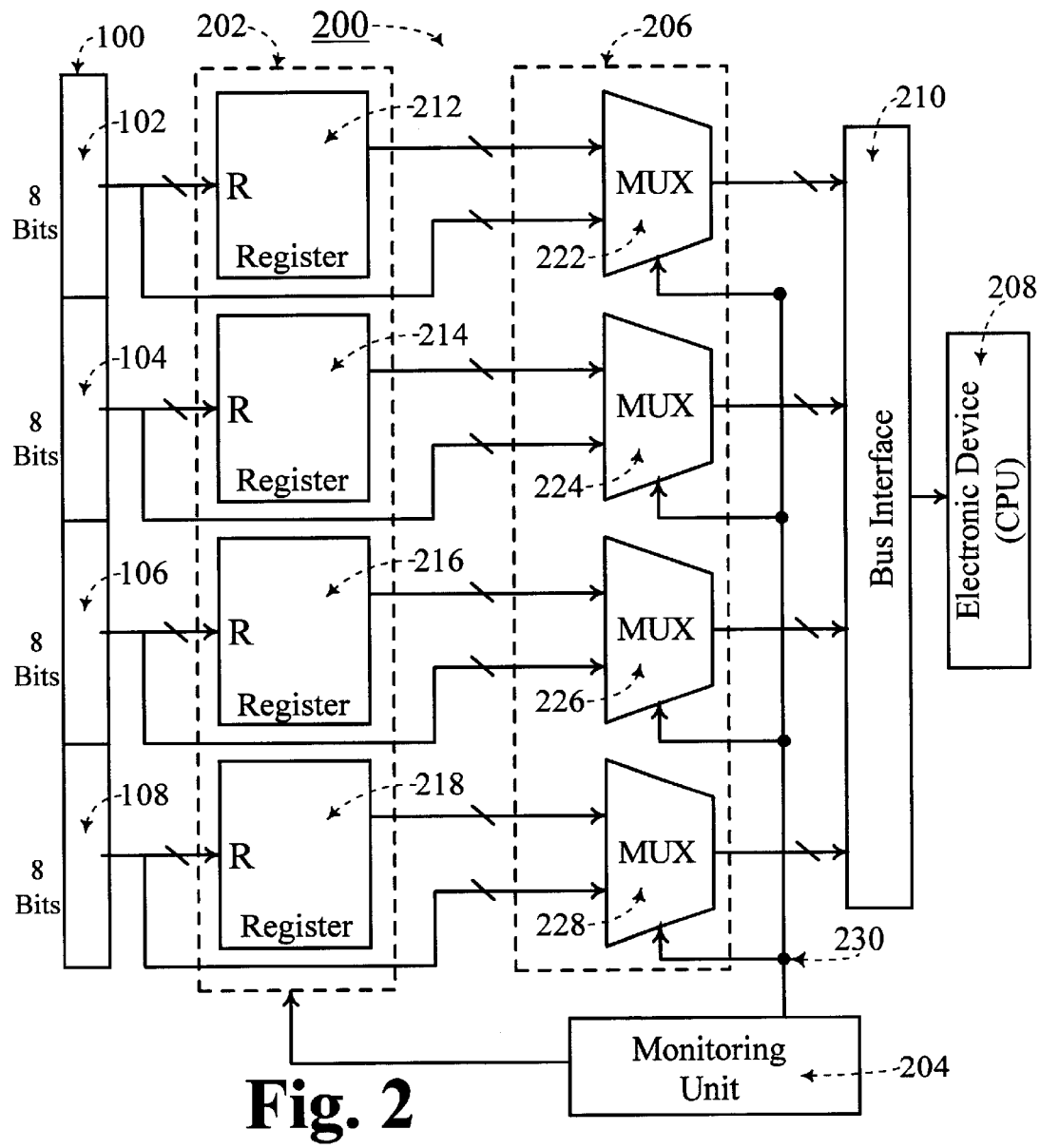
FIG. 2 shows a mechanism for ensuring data coherency among the plurality of portions when such data is read at least one portion at a time, according to a preferred embodiment of the present invention.

Referring to FIG. 2, an apparatus 200 of the present invention includes elements for a mechanism that ensures data coherency when data from the data generator 100 is read sequentially at least one portion at a time. (Elements having the same reference number in FIGS. 1 and 2 refer to elements having similar structure and function.) The apparatus 200 includes a data storage unit 202 (shown within dashed lines), a monitoring unit 204, and a multiplexing unit 206 (shown within dashed lines).

An electronic reading device 208 (such as a CPU of a computer system for example) is reading via a bus interface 210 (as is commonly known to one of ordinary skill in the art of digital systems) data from the data generator 100. The data generator 100 is similar to that described herein with respect to FIG. 1 and contains a plurality of portions. The electronic reading device 208 may not read all of the bits within the data generator 100 at once. Instead, the electronic reading device 208 may sequentially read the bits within the data generator 100 at least one portion at a time.

The operation of the apparatus 200 of the present invention ensures coherency among the portions of data read by the electronic reading device 208. Referring to FIG. 2, the data storage unit 202 includes a plurality of registers. A first register 212 stores the first portion 102 of the data within the data generator, a second register 214 stores the second portion 104, a third register 216 stores the third portion 106, and a fourth register 218 stores the fourth portion 108. The registers, 212, 214, 216, and 218 together store a status of the data bits from the data generator 100 at a particular point in time. Thus, the outputs of the registers, 212, 214, 216, and 218 preserve the status of substantially all of the bits from the data generator 100 at a particular point in time. Thus, the bits of the output of the data storage unit 202 are coherent and accurately represent the data within the data generator 100 at that particular point in time.

The outputs of the registers, 212, 214, 216, and 218 are inputs to the multiplexing unit 206. The multiplexing unit 206 includes a first multiplexer 222 having the output of the first register 212 and the first portion 102 of the data from the data generator 100 as inputs. The multiplexing unit 206 also includes a second multiplexer 224 having the output of the second register 214 and the second portion 104 of the data from the data generator 100 as inputs. The multiplexing unit 206 further includes a third multiplexer 226 having the output of the third register 216 and the third portion 106 of the data from the data generator 100 as inputs. The multiplexing unit 206 also includes a fourth multiplexer 228 having the output of the fourth register 218 and the forth portion 108 of the data from the data generator 100 as inputs.

The monitoring unit 204 controls each of the multiplexers 222, 224, 226, and 228 to select between the respective two inputs for each of the multiplexers 222, 224, 226, and 228. For example, assume that the electronic reading device 208 begins to read the data from the data generator 100 having a prior status at a prior time point. Assume that the electronic reading device 208 has sufficient data capacity to sequentially read one data portion at a time. At that prior time point, the electronic reading device 208 reads in one of the data portions 102, 104, 106, and 108. The electronic reading device 208 then subsequently reads the other data portions sequentially.

In order that the data portions accurately represent the prior status of the data within the data generator 100 at the prior time point, the data storage unit 202 retains the prior status of the bits of the data at the prior time point for each data portion 102, 104, 106, and 108. The output of each register 212, 214, 216, and 218 is a respective portion of that data with bits having the prior status of the prior time point. Although the portions of the data 102, 104, 106, and 108 are constantly changing with time within the data generator 100, the outputs of the registers 212, 214, 216, and 218 remain fixed at the prior status of the prior time point.

The multiplexing unit 206 then transfers portions of data having the prior status of the prior time point to the electronic reading device 208 while the electronic reading device 208 continues to read the plurality of portions of the data of the prior time point. The monitoring unit 204 monitors and determines that the electronic reading device 208 is continuing to read the plurality of portions of the data having the prior status of the prior time point. In that case, the monitoring unit 204 controls the multiplexers 222, 224, 226, and 228 with a control signal 230 to select and transfer data portions having the prior status from the data storage unit 202 to the bus interface 210.

Once substantially all of the data bits having the prior status of the prior time point has been read by the electronic reading device 208, the electronic reading device 208 is ready to similarly read portions of the data having a subsequent status of a subsequent time point within the data generator 100. The monitoring unit 204 determines that the reading device begins to read at least one portion of the data within the data generator 100 having the subsequent status at the subsequent time point. In that case, the monitoring unit 204 controls with the control signal 230 the multiplexers 222, 224, 226, and 228 of the multiplexing unit 206 to transfer to the bus interface 210 at least one portion of data having the subsequent status from the data generator 100.

In addition, the monitoring unit 204 then also controls the data storage unit 202 to store portions of the data having the subsequent status. With this storage of the data having the subsequent status, data coherency of the data at the subsequent time point is also preserved as the electronic reading device 208 sequentially reads at least one data portion at a time. Such a process for preserving coherency of data thus repeats for data read by the electronic reading device 208 at each of further subsequent time points.

Figure 3:
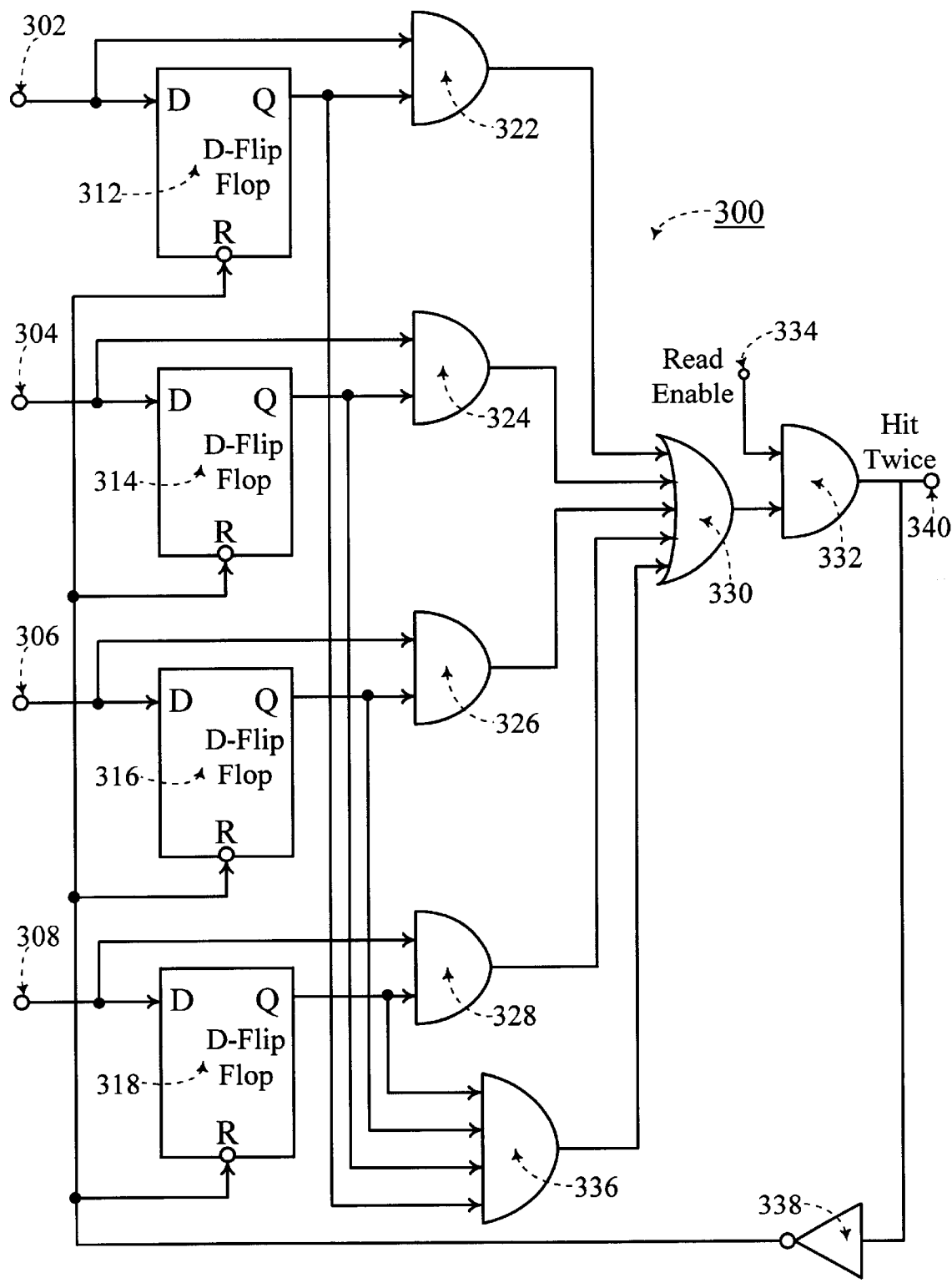
FIG. 3 shows an implementation for determining when a reading device makes a transition from reading a prior status of data to a subsequent status of data in the mechanism of FIG. 2, according to a preferred embodiment of the present invention.

Referring to FIG. 3, an example implementation 300 of the monitoring unit 204 of FIG. 2 is shown. The monitoring unit 300 includes a first data portion enable 302 which is a high state when the electronic reading device 208 requests to read the first portion 102 of the data of a particular time point from the data generator 100. The monitoring unit 300 also includes a second data portion enable 304 which is a high state when the electronic reading device 208 requests to read the second portion 104 of the data of that particular time point. The monitoring unit 300 further includes a third data portion enable 306 which is a high state when the electronic reading device 208 requests to read the third portion 106 of the data at that particular time point. Finally, the monitoring unit 300 also includes a fourth data portion enable 308 which is a high state when the electronic reading device 208 requests to read the fourth portion 108 of the data at that particular time point.

The monitoring unit 300 determines whether the electronic reading device 208 is continuing to read the plurality of portions of the data having a prior status of a prior time point. Furthermore, the monitoring unit 300 also determines when the electronic reading device 208 begins reading at least one portion of the data from the data generator 100 having a subsequent status at a subsequent time point. The monitoring unit makes such determinations by monitoring when any of the data portion enables 302, 304, 306, and 308 are high for a second time.

The electronic reading device 208 sets the data portion enables 302, 304, 306, and 308 to be a high state or a low state to indicate which of the data portions is requested for a read. If the data portion enable corresponding to a particular data portion is a high state, then the electronic reading device 208 is requesting to read that particular data portion. The monitoring unit determines when the electronic reading device 208 begins reading at least one portion of the data from the data generator 100 having a subsequent status at a subsequent time point, after having read data portions of a prior status at a prior time point, by determining when any data portion enable is a high state for a second time.

When any data portion is a high state for a second time, the electronic device has already utilized that data portion from data having a prior status at a prior time point. Thus, the electronic reading device 208 is requesting to begin reading the data from the data generator 100 having a subsequent status at a subsequent time point after having already read data portions of a prior status at a prior time point.

The monitoring unit 300 detects when any data portion is a high state for a second time by using delay flip-flops. A first delay flip-flop 312 has the first data portion enable 302 as input, a second delay flip-flop 314 has the second data portion enable 304 as input, a third delay flip-flop 316 has the third data portion enable 306 as input, and a fourth delay flip-flop 318 has the fourth data portion enable 308 as input.

Furthermore in the monitoring unit 300, a first AND-gate 322 has the first data portion enable 302 and the output of the first delay flip-flop 312 as inputs. Similarly, a second AND-gate 324 has the second data portion enable 304 and the output of the second delay flip-flop 314 as inputs. Also, a third AND-gate 326 has the third data portion enable 306 and the output of the third delay flip-flop 316 as inputs. Finally, a fourth AND-gate 328 has the fourth data portion enable 308 and the output of the fourth delay flip-flop 318 as inputs.

With the implementation 300 of FIG. 3, the output of any of the AND-gates 322, 324, 326, and 328 goes high when the respective data portion enable coupled to that AND-gate goes high for a second time. The outputs of the AND-gates 322, 324, 326, and 328 are inputs to an OR-gate 330. The output of the OR-gate 330 is input to a fifth AND-gate 332. The other input of the fifth AND-gate 332 is a read enable 334 which is set high when the electronic reading device 208 requests data to be transferred to the bus interface 210.

A sixth AND-gate 336 has the outputs of the four delay flip-flops 312, 314, 316, and 318 as inputs. The output of the sixth AND-gate 336 turns high when all four data portion enables 302, 304, 306, and 308 have turned high (i.e., when the electronic reading device 208 requests to read all of the bits within the data generator 100 simultaneously at once). In that case, data coherency between the portions of data is not a problem, and the data portions may be coupled directly from the data generator 100 to the bus interface 210. The output of the sixth AND-gate 336 is also an input to the OR-gate 330.

In all cases, the output of the fifth AND-gate 332 is a Hit_Twice control signal 340 which is coupled as the control signal 230 of FIG. 2. Referring to FIGS. 2 and 3, when the electronic reading device 208 is continuing to read the plurality of portions of the data having a prior status of a prior time point, the outputs of the AND-gates 322, 324, 326, 328, and 336 are low. Thus, the Hit_Twice control signal 340 is low indicating that the electronic reading device 208 is continuing to read the plurality of portions of the data having the prior status of the prior time point. In that case, the Hit-Twice control signal 340 is applied as the control signal 230 to the multiplexers 222, 224, 226, and 228 of FIG. 2, and controls those multiplexers to transfer data portions having the prior status of the prior time point from the data storage unit 202 to the bus interface 210.

Then, when any of the data portion enables 302, 304, 306, and 308 turns high for a second time indicating that the corresponding data portion is being read for a second time, the output of one of the AND gates 322, 324, 326, and 328 corresponding to that data portion turns high. In that case, the output Hit_Twice 340 of the fifth AND-gate 332 turns high. This high Hit_Twice control signal 340 is applied as the control signal 230 to the multiplexers 222, 224, 226, and 228 of FIG. 2, and controls those multiplexers to transfer data having a subsequent status of a subsequent time point from the data generator 100. This high Hit_Twice control signal 340 also controls the data storage unit 202 to store data portions having this subsequent status of the subsequent time point.

Furthermore, the high Hit_Twice control signal 340 also controls the delay flip-flops 312, 314, 316, and 318 via an inverter 338 to toggle in the respective data portion enables 302, 304, 306, and 308 at that subsequent time point. Then, the monitoring unit 300 repeats monitoring whether the reading device continues to read the data having this subsequent status of the subsequent time point until the reading device requests data having a even further subsequent status at an even further subsequent time point.

In this manner, the apparatus and method of the present invention ensures data coherency among a plurality of portions of data read in sequential portions by the electronic reading device 208. The present invention stores the status of all of the bits of data from the data generator at a prior time point. The present invention then transfers data portions from the data thus stored as the reading device 208 continues to sequentially read portions of data of the prior time point. When the reading device has finished reading the portions of the data of the prior time point, the present invention stores the status of the bits of data within the data generator at a subsequent time point, and the process of ensuring coherency between the portions read repeats for that subsequent time point. Thus, the present invention allows the electronic reading device to read in data, portions at a time, while ensuring coherency among those portions and thus accuracy in the data read by the electronic reading device.

The foregoing is by way of example only and is not intended to be limiting. For example, the present invention may be implemented for any number of data bits within the data generator 100 and for any number of bits within any number of data portions as would be apparent to one of ordinary skill in the art of digital system design from the description herein. The present invention may be implemented for any type of data generator and reading device. The invention is limited only as defined in the following claims and equivalents thereof.

I claim:

1. An apparatus for enhancing data coherency when data comprising a plurality of portions is read sequentially at least one portion at a time by a reading device, wherein the data that is provided by a data generator changes with time, the apparatus comprising:

a data storage unit for storing the plurality of portions of the data having a prior status at a prior time point when the reading device begins to sequentially read at least one portion of the data at the prior time point;

a monitoring unit for determining whether the reading device is continuing to sequentially read the plurality of portions of the data having the prior status of the prior time point; and a multiplexing unit, operatively coupled to the data storage unit, the reading device, and the monitoring unit, for transferring at least one portion of the data having the prior status from the data storage unit to the reading device when the reading device continues to sequentially read at least one portion of the data having the prior status of the prior time point;

wherein said data at said data generator changes with time during said sequential reading of the portions of the data having the prior status of the prior time point;

and wherein said monitoring unit determines when the reading device begins sequentially reading at least one portion of the data having a subsequent status at a subsequent time point;

and wherein the data storage unit stores the plurality of portions of the data having the subsequent status of the subsequent time point when the reading device begins sequentially reading at least one portion of the data having the subsequent status at the subsequent time point;

and wherein said multiplexing unit transfers to the reading device from the data storage unit at least one portion of the data having the subsequent status of the subsequent time point when the reading device begins sequentially reading at least one portion of the data having the subsequent status at the subsequent time point.

2. The apparatus of claim 1, wherein the data storage unit includes a plurality of registers, and wherein each register stores a respective portion of the plurality of portions of the data.

3. The apparatus of claim 1, wherein the monitoring unit monitors whether any portion of the plurality of portions of the data is read for a second time in determining that the reading device begins reading the data having the subsequent status.

4. The apparatus of claim 3, wherein the data storage unit includes a plurality of registers, and wherein each register stores a respective portion of the plurality of portions of the data.

5. An apparatus for enhancing data coherency when data comprising a plurality of portions is read sequentially at least one portion at a time by a reading device, wherein the data that is provided by a data generator changes with time, the apparatus comprising:

means for storing the plurality of portions of the data having a prior status at a prior time point when the reading device begins to sequentially read at least one portion of the data at the prior time point;

means for determining whether the reading device is continuing to sequentially read the plurality of portions of the data having the prior status of the prior time point;

means for transferring at least one portion of the data having the prior status when the reading device continues to sequentially read at least one portion of the data having the prior status of the prior time point;

wherein said data at said data generator changes with time during said sequential reading of the portions of the data having the prior status of the prior time point;

means for determining when the reading device begins sequentially reading at least one portion of the data having a subsequent status at a subsequent time point;

means for storing the plurality of portions of the data having the subsequent status when the device begins sequentially reading the data having the subsequent status; and means for transferring at least one portion of the data having the subsequent status of the subsequent time point when the device begins sequentially reading the data having the subsequent status.

6. The apparatus of claim 5, wherein the means for storing includes a plurality of registers, and wherein each register stores a respective portion of the plurality of portions of the data.

7. The apparatus of claim 5, wherein the means for determining when the reading device begins reading the data having the subsequent status, monitors when any portion of the plurality of portions of the data is read for a second time in determining that the reading device begins reading the data having the subsequent status.

8. A method for enhancing data coherency when data comprising a plurality of portions is read sequentially at least one portion at a time by a reading device, wherein the data that is provided by a data generator changes with time, the method including the steps of:

storing the plurality of portions of the data having a prior status at a prior time point when the reading device begins to sequentially read at least one portion of the data at the prior time point;

determining whether the reading device is continuing to sequentially read the plurality of portions of the data having the prior status of the prior time point;

transferring at least one portion of the data having the prior status to the reading device when the reading device continues to sequentially read at least one portion of the data having the prior status of the prior time point;

wherein said data at said data generator changes with time during said sequential reading of the portions of the data having the prior status of the prior time point;

determining when the reading device begins sequentially reading at least one portion of the data having a subsequent status at a subsequent time point;

storing the plurality of portions of the data having the subsequent status when the device begins sequentially reading the data having the subsequent status; and transferring at least one portion of the data having the subsequent status of the subsequent time point when the device begins sequentially reading the data having the subsequent status.

9. The method of claim 8, wherein the step of determining when the reading device begins reading at least one portion of the data having the subsequent status includes the step of:

monitoring when any portion of the plurality of portions of data is read for a second time in determining that the reading device begins reading the data having the subsequent status.

* * * * *